US009826305B2

(12) United States Patent
Tu et al.

(10) Patent No.: US 9,826,305 B2
(45) Date of Patent: Nov. 21, 2017

(54) CONTROLLING VOLTAGE OF A SPEAKER BASED ON TEMPERATURE

(71) Applicant: Realtek Semiconductor Corp., Hsinchu (TW)

(72) Inventors: Yi-Chang Tu, Tainan (TW); Chao-Wei Chang, New Taipei (TW); Ming-Cheng Chiang, Hsin Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 173 days.

(21) Appl. No.: 14/645,152

(22) Filed: Mar. 11, 2015

(65) Prior Publication Data

US 2015/0263684 A1 Sep. 17, 2015

(30) Foreign Application Priority Data

Mar. 14, 2014 (TW) ............................ 103109673 A

(51) Int. Cl.
*H03G 11/00* (2006.01)
*H04R 3/00* (2006.01)
*H04R 29/00* (2006.01)

(52) U.S. Cl.
CPC ............... *H04R 3/00* (2013.01); *H04R 3/007* (2013.01); *H04R 29/001* (2013.01)

(58) Field of Classification Search
CPC .................................. H04R 3/00; H04R 3/007
USPC ...................................................... 381/55, 59
See application file for complete search history.

(56) References Cited

U.S. PATENT DOCUMENTS

2004/0178852 A1* 9/2004 Neunaber ................. H03F 1/52 330/284
2009/0220110 A1* 9/2009 Bazarjani .............. H03F 1/0211 381/120
2013/0034250 A1* 2/2013 Ozaki .................. H03F 1/3205 381/120
2013/0076381 A1 3/2013 Takayanagi et al.
(Continued)

FOREIGN PATENT DOCUMENTS

JP S58101597 A 6/1983
JP 2001028797 A 1/2001
(Continued)

*Primary Examiner* — Katherine Faley
(74) *Attorney, Agent, or Firm* — Muncy, Geissler, Olds & Lowe, P.C.

(57) ABSTRACT

An audio device includes a digital-to-analog converter, an amplifier, a speaker, a power management unit and a temperature sensor. The digital-to-analog converter is configured to convert a digital audio signal into an analog audio signal. The amplifier is coupled to the digital-to-analog converter and configured to amplify the analog audio signal and generate an amplified analog audio signal. The speaker is coupled to the amplifier and configured to broadcast the amplified analog audio signal. The power management unit is configured to provide the amplifier with a first working voltage and provide the digital-to-analog converter with a second working voltage. The temperature sensor is coupled to the speaker and configured to generate a temperature detection signal according to a temperature of the speaker. Wherein, the power management unit adjusts at least one of the first working voltage and the second working voltage according to the temperature detection signal.

14 Claims, 9 Drawing Sheets

(56) References Cited

U.S. PATENT DOCUMENTS

| | | | | |
|---|---|---|---|---|
| 2013/0077794 | A1* | 3/2013 | Risbo .................. | H03G 11/008 381/55 |
| 2013/0083928 | A1 | 4/2013 | Williams et al. | |
| 2014/0126730 | A1* | 5/2014 | Crawley ............. | H04R 29/001 381/59 |

FOREIGN PATENT DOCUMENTS

| | | | |
|---|---|---|---|
| TW | 200412729 | A | 7/2004 |
| TW | 200742477 | | 11/2007 |
| TW | M440477 | U | 11/2012 |
| TW | 201319534 | | 5/2013 |
| TW | 2013040732 | A | 10/2013 |

* cited by examiner

CONTROLLING VOLTAGE OF A SPEAKER BASED ON TEMPERATURE

BACKGROUND OF THE INVENTION

Field of the Invention

The invention relates to an audio device and, more particularly, to an audio device having a thermal control capability and a control method of the audio device.

Description of the Related Art

FIG. 1 shows a schematic diagram illustrating a conventional audio device 100. The audio device 100 includes a gain controller 101, a speaker 102, a temperature sensor 103, a digital-to-analog converter (DAC) 104, and an amplifier 105. The gain controller 101 receives an audio signal Dau and applies gain to the audio signal Dau to generate a gain-controlled audio signal Gau. The gain-controlled audio signal Gau is digitalized by the digital-to-analog converter 104 and then sent to a speaker 102 via the amplifier 105. The temperature sensor 103 detects the temperature of the speaker 102 to generate a temperature detection signal Td. In case the temperature of the speaker 102 exceeds a preset value, the gain controller 101 may attenuate the audio signal Dau in accordance with the temperature detection signal Td to lower the sound volume of the speaker 102. Therefore, the power and working temperature of the speaker 102 are decreased to prevent the speaker 102 from being overdriven and damaged.

However, in the conventional audio device 100, the temperature of the speaker 102 is decreased by attenuating the audio signal Dau, but the working voltage for the speaker 102 is still unchanged to cause considerable power consumption. Besides, according to the thermal control method of the audio device 100, the temperature of the speaker 102 is adjusted merely around a preset value to result in unsatisfactory control accuracy.

BRIEF SUMMARY OF THE INVENTION

The invention provides a thermal protection mechanism for a speaker, where the thermal protection mechanism is established by an individual thermal model of the speaker based on the detection of speaker temperature.

The invention also provides a device and method capable of reducing power consumption of a speaker and protecting the speaker.

According to an embodiment of the invention, an audio device having a thermal control capability includes a digital-to-analog converter, an amplifier, a speaker, a power management unit and a temperature sensor. The digital-to-analog converter is configured to convert a digital audio signal into an analog audio signal. The amplifier is coupled to the digital-to-analog converter and configured to amplify the analog audio signal and generate an amplified analog audio signal. The speaker is coupled to the amplifier and configured to broadcast the amplified analog audio signal. The power management unit is configured to provide the amplifier with a first working voltage and provide the digital-to-analog converter with a second working voltage. The temperature sensor is coupled to the speaker and configured to generate a temperature detection signal according to a temperature of the speaker. Wherein, the power management unit adjusts at least one of the first working voltage and the second working voltage according to the temperature detection signal.

According to another embodiment of the invention, a control method of an audio device includes the following steps. First, a highest thermal threshold and a lowest thermal threshold are set for a speaker according to the characteristic of the speaker, and then the temperature of the speaker is detected. When the temperature of the speaker is higher than the highest thermal threshold, a working voltage for the amplifier and/or a working voltage for the digital-to-analog converter are decreased. When the temperature of the speaker is lower than the lowest thermal threshold, the working voltage for the amplifier and/or the working voltage for the digital-to-analog converter are increased until the temperature of the speaker is higher than the lowest thermal threshold.

According to another embodiment of the invention, a control method of an audio device includes the following steps. First, multiple thermal control stages are set according to the characteristic of a speaker, where each of the thermal control stages corresponds to a preset voltage adjustment procedure. Then, the speaker temperature is detected to recognize which thermal control stage the current temperature is located in and to select a corresponding voltage adjustment procedure. The selected voltage adjustment procedure is applied to adjusting a working voltage for an amplifier and/or a working voltage for a digital-to-analog converter.

Accordingly to the above embodiments, the temperature of the speaker can be lowered by decreasing at least one of a first working voltage and a second working voltage generated by a power management unit, without simply attenuating an input audio signal. Therefore, the dissipation of electric power is reduced to achieve the purpose of power saving, and the control accuracy is also improved.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 2A:
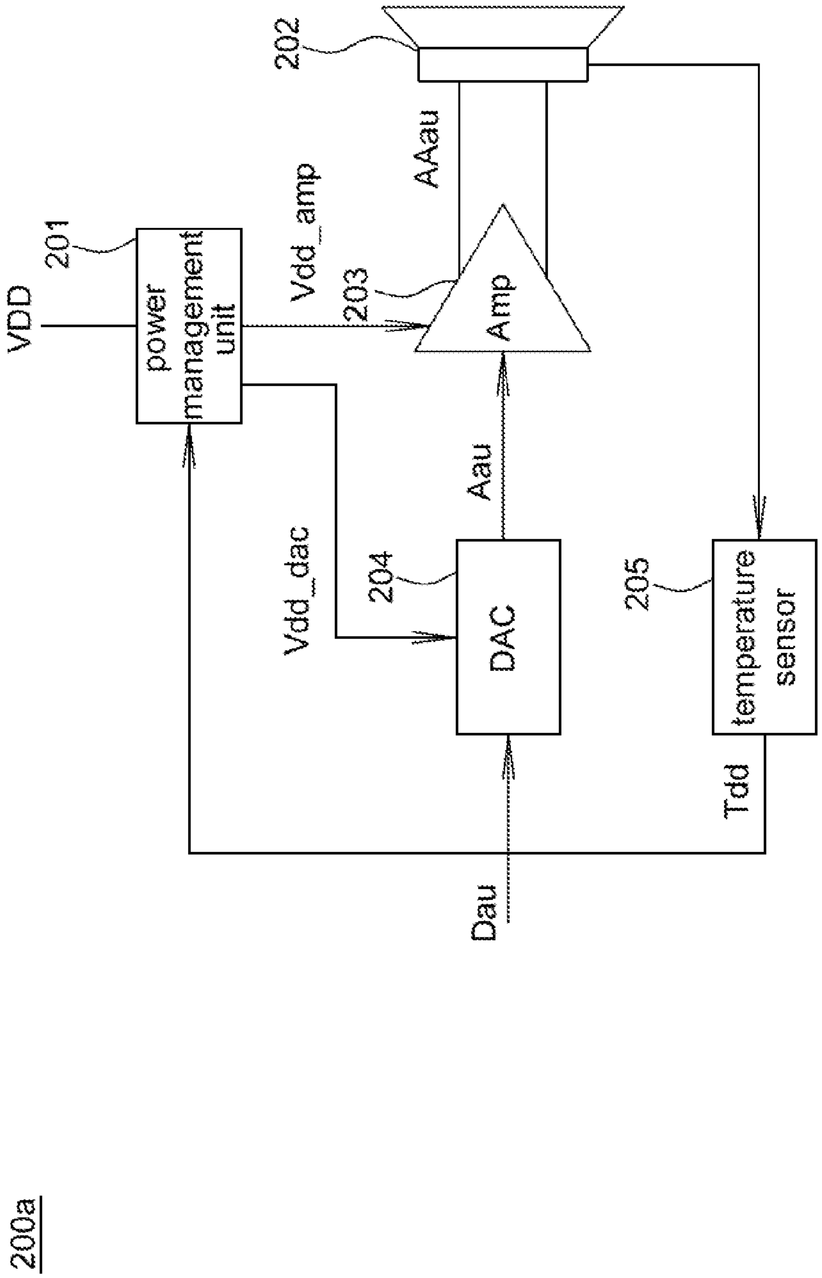
FIG. 2A shows a schematic diagram illustrating an audio device with a thermal control capability according to an embodiment of the invention.

FIG. 2A shows a schematic diagram illustrating an audio device with a thermal control capability according to an embodiment of the invention. Referring to FIG. 2A, the audio device 200*a* includes a power management unit 201, a speaker 202, an amplifier 203, a digital-to-analog converter (DAC) 204 and a temperature sensor 205.

The digital-to-analog converter 204 is configured to convert a digital audio signal Dau into an analog audio signal Aau.

The amplifier 203 is coupled to the digital-to-analog converter 204. The amplifier 203 is configured to amplify the analog audio signal Aau to generate an amplified analog audio signal AAau that is output to the speaker 202.

The speaker 202 is coupled to the amplifier 203 and configured to broadcast the amplified analog audio signal AAau.

The temperature sensor 205 is coupled to the speaker 202, and is configured to detect a temperature of the speaker 202 and generate a temperature detection signal Td according to the temperature of the speaker 202. In one embodiment, the temperature sensor 205 may detect a temperature of a resistor in the speaker 202. Certainly, among various designs of the speaker 202, the temperature sensor 205 may detect a temperature of other internal component of the speaker 202 or a room temperature inside the speaker 202.

The power management unit 201 is coupled to a power supply voltage VDD. The power management unit 201 is configured to provide the amplifier 203 with a first working voltage Vdd_amp and provide the digital-to-analog converter 204 with a second working voltage Vdd_dac. The power management unit 201 is allowed to adjust at least one of the first working voltage Vdd_amp and the second working voltage Vdd_dac. For example, the power management unit 201 may lower the first working voltage Vdd_amp and/or the second working voltage Vdd_dac to decrease a sound volume of the speaker 202 and hence the temperature of the speaker 202.

Therefore, according to the above embodiment, at least one of the first working voltage Vdd_amp for the amplifier 203 and the second working voltage Vdd_dac for the digital-to-analog converter 204 can be adjusted to decrease the temperature of the speaker 202 and protect the speaker 202 as a result.

When the temperature of the speaker 202 reaches a preset value, the audio device 200*a* may adjust both of the first working voltage Vdd_amp and the second working voltage Vdd_dac simultaneously or in a time-division manner. Alternatively, the audio device 200*a* may adjust either the voltage Vdd_amp or the second working voltage Vdd_dac. Besides, the first working voltage Vdd_amp and the second working voltage Vdd_dac may be adjusted to any extent according to actual needs. For example, the first working voltage Vdd_amp and the second working voltage Vdd_dac may be set to be equal or non-equal.

Figure 2B:
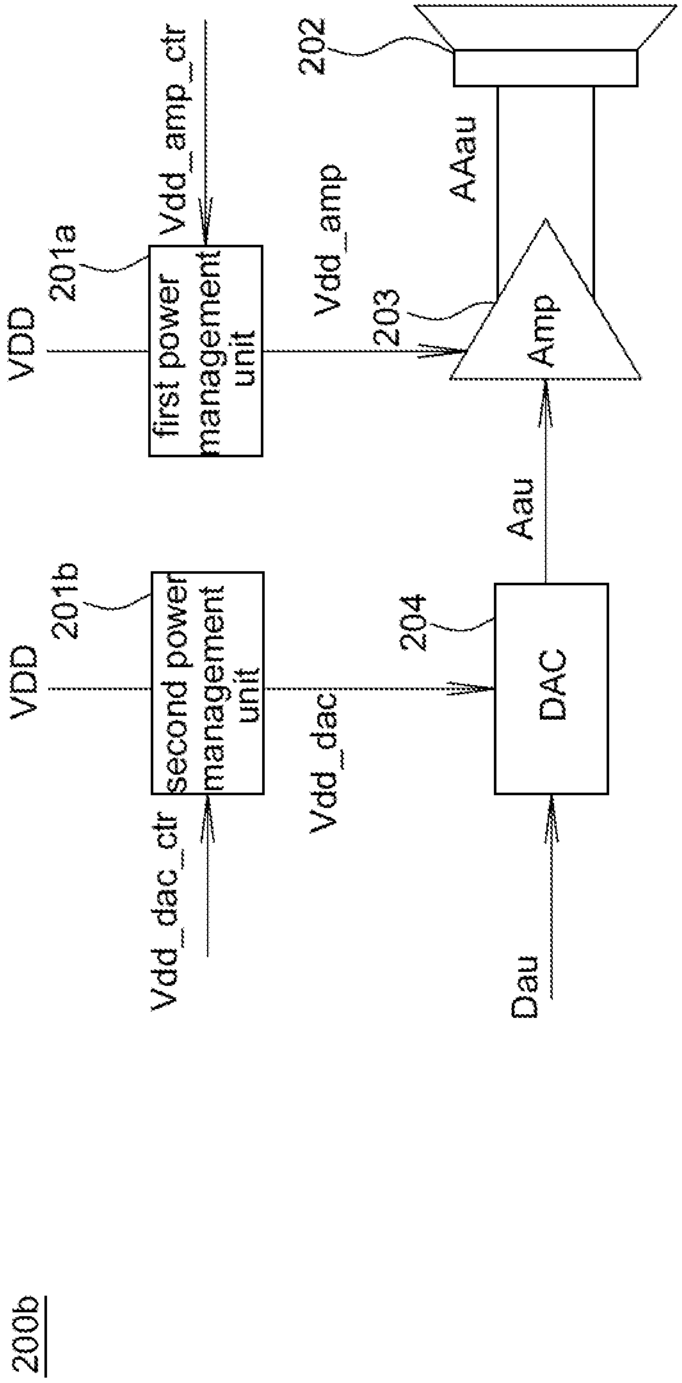
FIG. 2B shows a schematic diagram illustrating an audio device with a thermal control capability according to another embodiment of the invention.

FIG. 2B shows a schematic diagram illustrating an audio device with a thermal control capability according to another embodiment of the invention. Referring to FIG. 2B, an audio device 200*b* includes a first power management unit 201*a*, a second power management unit 201*b*, a speaker 202, an amplifier 203, and a digital-to-analog converter 204. As compared with the audio device 200*a*, the audio device 200*b* includes two power management units 201*a* and 201*b*. The first power management unit 201*a* is coupled to a power supply voltage VDD and provides the amplifier 203 with a first working voltage Vdd_amp, and the first power management unit 201*a* adjusts the first working voltage Vdd_amp according to a detected temperature of the speaker 202. For example, in order to lower the temperature of the speaker 202, the first working voltage Vdd_amp may be decreased in response to a first voltage control signal Vdd_amp_ctr that signals a variation in the temperature of the speaker 202. Similarly, the second power management unit 201*b* is coupled to a power supply voltage VDD and provides the digital-to-analog converter 204 with a second working voltage Vdd_dac, and the second power management unit 201*b* adjusts the second working voltage Vdd_dac according to a detected temperature of the speaker 202. For example, in order to lower the temperature of the speaker 202, the second working voltage Vdd_dac may be decreased in response to a second voltage control signal Vdd_dac_ctr that signals a variation in the temperature of the speaker 202.

Figure 3A:
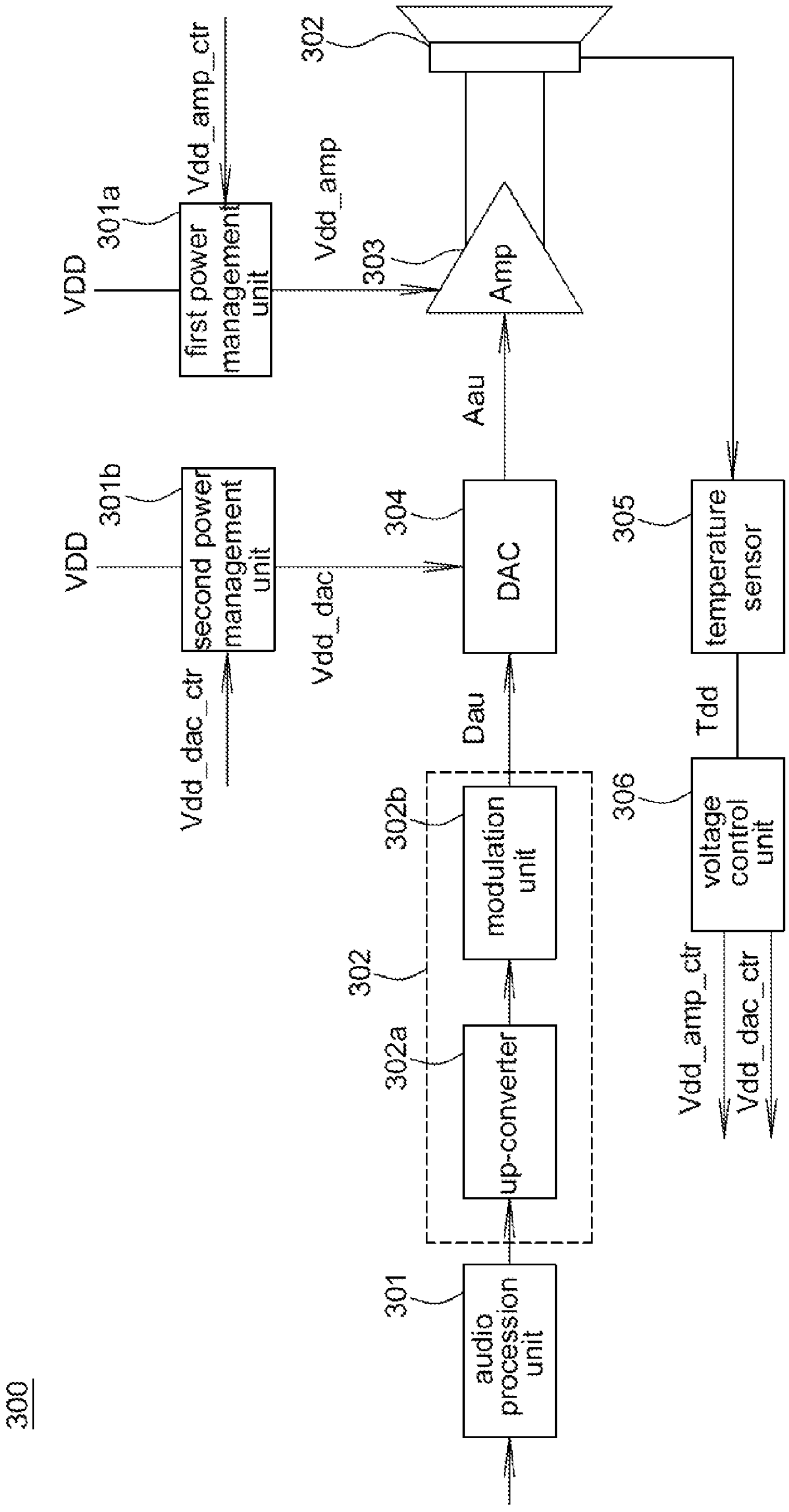
FIG. 3A shows a schematic diagram illustrating an audio device with a thermal control capability according to another embodiment of the invention.

FIG. 3A shows a schematic diagram illustrating an audio device with a thermal control capability according to another embodiment of the invention. Referring to FIG. 3A, an audio device 300 includes an audio procession unit 301, an interpolation filter 302, a first power management unit 301*a*, a second power management unit 301*b*, a speaker 302, an amplifier 303, a digital-to-analog converter 304, a temperature sensor 305 and a voltage control unit 306. The interpolation filter 302 may include an up-converter 302*a* and a modulation unit 302*b*.

In one embodiment, the audio procession unit 301 may be an equalizer (EQ) or an automatic level controller (ALC). In this embodiment, the audio procession unit 301 may include a gain controller (not shown) to apply gain to an audio signal received by the audio procession unit 301, and the gain may have a fixed value. In an alternate embodiment, the audio procession unit 301 may not include the gain controller.

The up-converter 302 is used to adjust the frequency of an audio signal, and the modulation unit 302*b* may modulate the frequency of the audio signal to a preset frequency band. The modulated audio signal is digitalized to form a digital audio signal Dau that is to be sent to the digital-to-analog converter 304.

The digital audio signal Dau is supplied to the digital-to-analog converter 304, the amplifier 303, the speaker 302, the power management unit 301*a*, the power management unit 301*b* and the audio device 200*b* to perform subsequent operations similar to afore-mentioned embodiments, which is not explained in further detail here. During operation, the temperature sensor 305 detects a temperature of the speaker 302 to generate a temperature detection signal Tdd, and the temperature detection signal Tdd is sent to the voltage control unit 306. The voltage control unit 306 generates a first voltage control signal Vdd_amp_ctr and a second voltage control signal Vdd_dac_ctr that signal a variation in the temperature of the speaker 202 according to the temperature detection signal Tdd. Then, the first power management unit 301*a* adjusts the first working voltage Vdd_amp for the amplifier 303 according to the first voltage control signal Vdd_amp_ctr, and the second power management unit 301*b* adjusts the second working voltage Vdd_dac for the digital-to-analog converter 304 according to the second voltage control signal Vdd_dac_ctr.

Figure 3B:
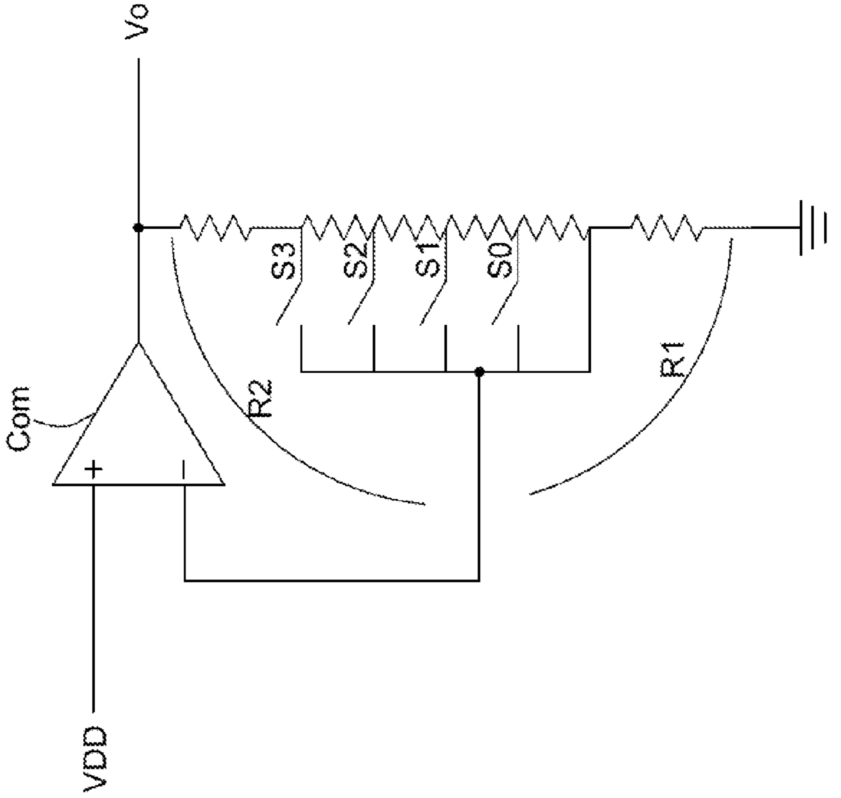
FIG. 3B shows a schematic diagram illustrating a power management unit according to an embodiment of the invention.

FIG. 3B shows a schematic diagram illustrating a power management unit according to an embodiment of the invention. Referring to FIG. 3B, a power management unit includes a comparator Com, multiple switches S0, S1, S2 and S3, and resistors R1 and R2. The power management unit is coupled to a power supply voltage VDD and multiplies the power supply voltage VDD by a ratio to generate an output voltage Vo serving as a first voltage control signal vdd_amp_crt or a second voltage control signal vdd_dac_crt. The switches S0, S1, S2 and S3 are selectively turned on and off to change the ratio determined by the resistances of the resistor R1 and the resistor R2, where the output voltage Vo satisfies: Vo=VDD×(R1+R2)/R1. In that case, the power management unit may provide the amplifier or the digital-to-analog converter with a suitable voltage value. Note the power management unit is not limited to the above configuration, and the type and number of components forming the power management are not restricted. For example, the number of switches is not limited to four, and the resistors may be replaced with transistors or other electronic devices.

Figure 1:
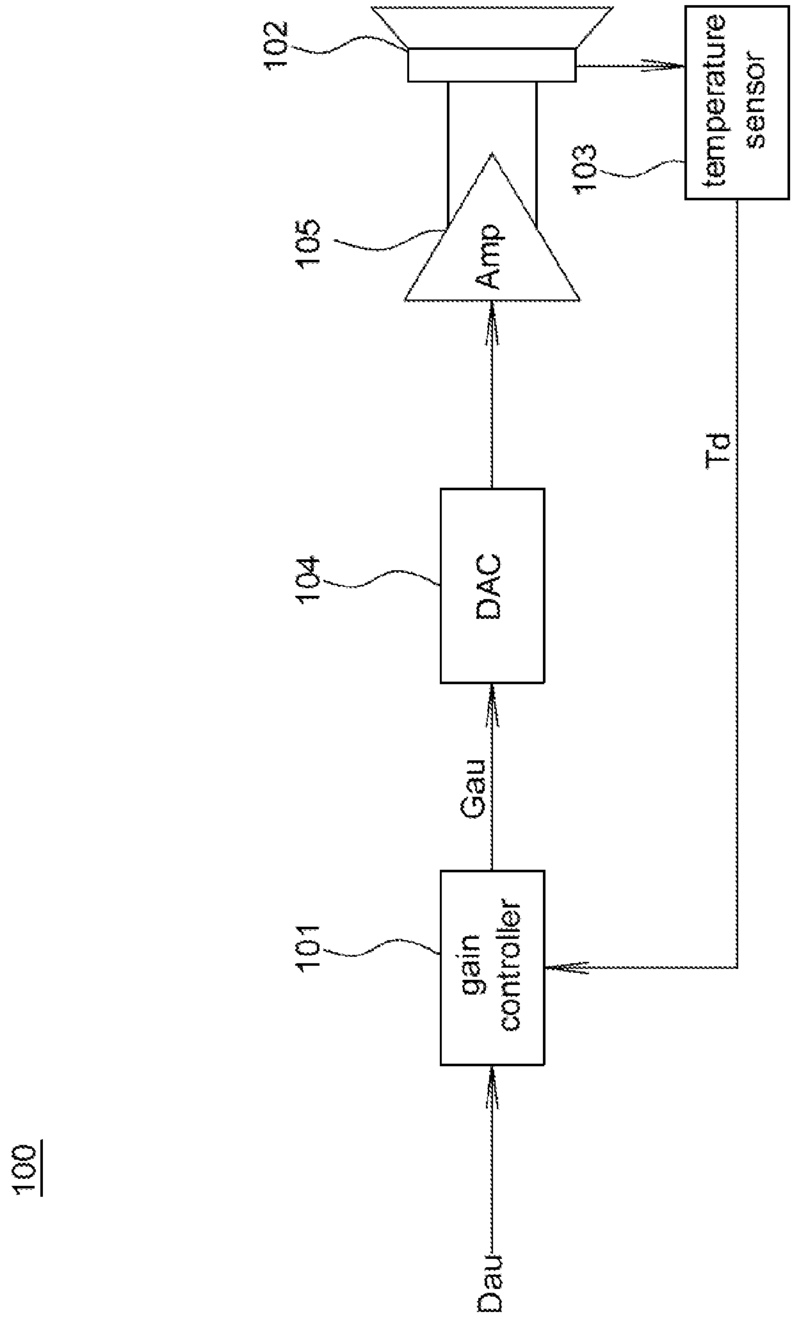
FIG. 1 (Prior Art)
FIG. 1 shows a schematic diagram illustrating a conventional audio device.
Figure 4A:
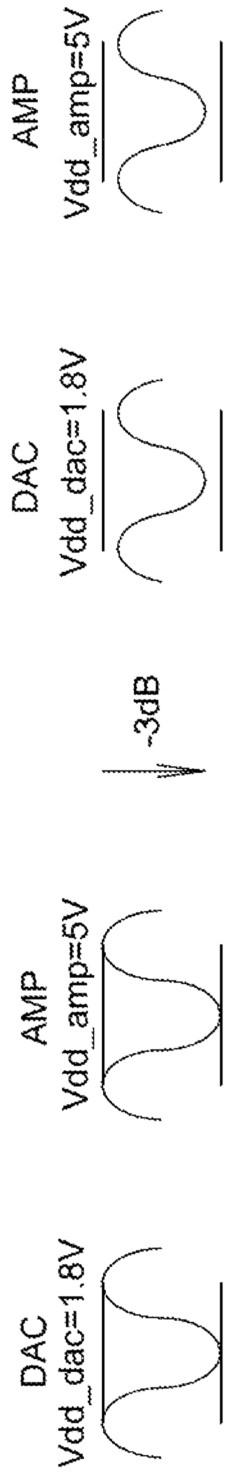
FIG. 4A (Prior Art)
FIG. 4A shows waveform diagrams for a conventional audio device shown in FIG. 1.
Figure 4B:
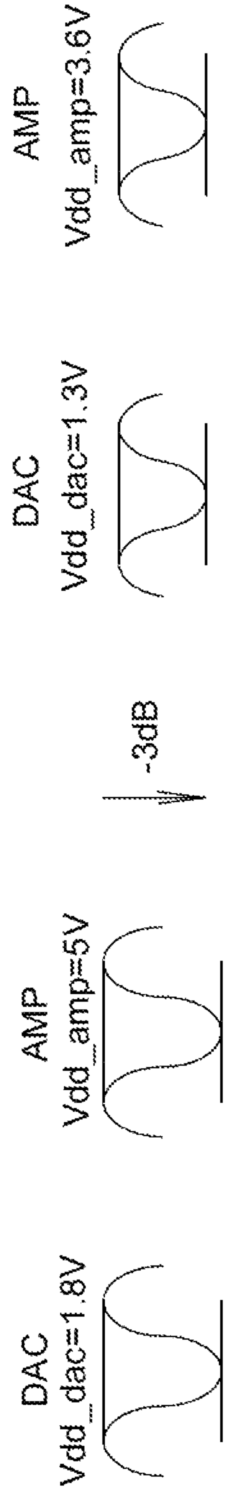
FIG. 4B shows waveform diagrams for an audio device shown in FIG. 3A according to an embodiment of the invention.

FIG. 4A shows waveform diagrams for a conventional audio device 100 shown in FIG. 1. FIG. 4B shows waveform diagrams for an audio device 300 shown in FIG. 3A according to an embodiment of the invention. As shown in FIG. 4A, the conventional audio device 100 operates under a signal control scheme. In case the speaker 102 is at a normal temperature, the working voltages for the digital-to-analog converter 104 and the amplifier 105 are assumed to be in a full scale (Vdd_dac=1.8V and Vdd_amp=5V). When the temperature of the speaker 102 exceeds a set limit, the temperature sensor 103 notifies the gain controller 101 to attenuate an input signal, such as causing a reduction of 3 dB in signal gain. Therefore, an input signal for the digital-to-analog converter 104 is reduced to be lower than 1.8V, and an input signal for the amplifier 105 is reduced to be lower than 5V to lower the temperature of the speaker 102 and hence protect the speaker 102. Under the circumstance, however, the working voltage for the digital-to-analog converter 104 is still kept at 1.8V, and the working voltage for the amplifier 105 is still kept at 5V.

In comparison, as shown in FIG. 4B, in case the speaker 302 is at a normal temperature, the working voltages for the digital-to-analog converter 304 and the amplifier 303 are assumed to be in a full scale (Vdd_dac=1.8V and Vdd_amp=5V). When the temperature of the speaker 102 exceeds a set limit, the temperature sensor 305 may generate a temperature detection signal Tdd and notifies the voltage control unit 306 to supply a first voltage control signal Vdd_amp_ctr and/or a second voltage control signal Vdd_dac_ctr to the first power management unit 301*a* and/or the second power management unit 301*b*. The first power management unit 301*a* and/or the second power management unit 301*b* may decrease the first working voltage Vdd_amp for the amplifier 303 and/or the second working voltage Vdd_dac for the digital-to-analog converter 304 according to the first voltage control signal Vdd_amp_ctr and/or the second voltage control signal Vdd_dac_ctr, such as causing a reduction of 3 dB in signal gain. Therefore, the first working voltage Vdd_amp for the amplifier 303 is decreased from 5V to 3.6V, and the second working voltage Vdd_dac for the digital-to-analog converter 304 is decreased from 1.8V to 1.3V. Under the circumstance, the above treatment for lowering the sound volume and hence protecting the speaker 302 may also serve the purpose of power saving. Note the numerical values described above are used only for exemplified purposes but not to limit the invention.

Further, in one embodiment, when the temperature of the speaker is unduly high, the voltage supplied to a digital-to-analog converter may be lowered by a low dropout regulator (LDO) to attenuate an output audio signal and thus lower the sound volume, the power consumption and the temperature of the speaker. Further, under the condition that an output audio signal is not clipped, the voltage supplied to an amplifier may be also lowered to reduce power consumption. According to the above embodiments, the first working voltage for the amplifier and/or the second working voltage for the digital-to-analog converter can be reduced, without attenuating an input signal, to decrease power consumption and prevent the speaker from being overheated.

Figure 5A:
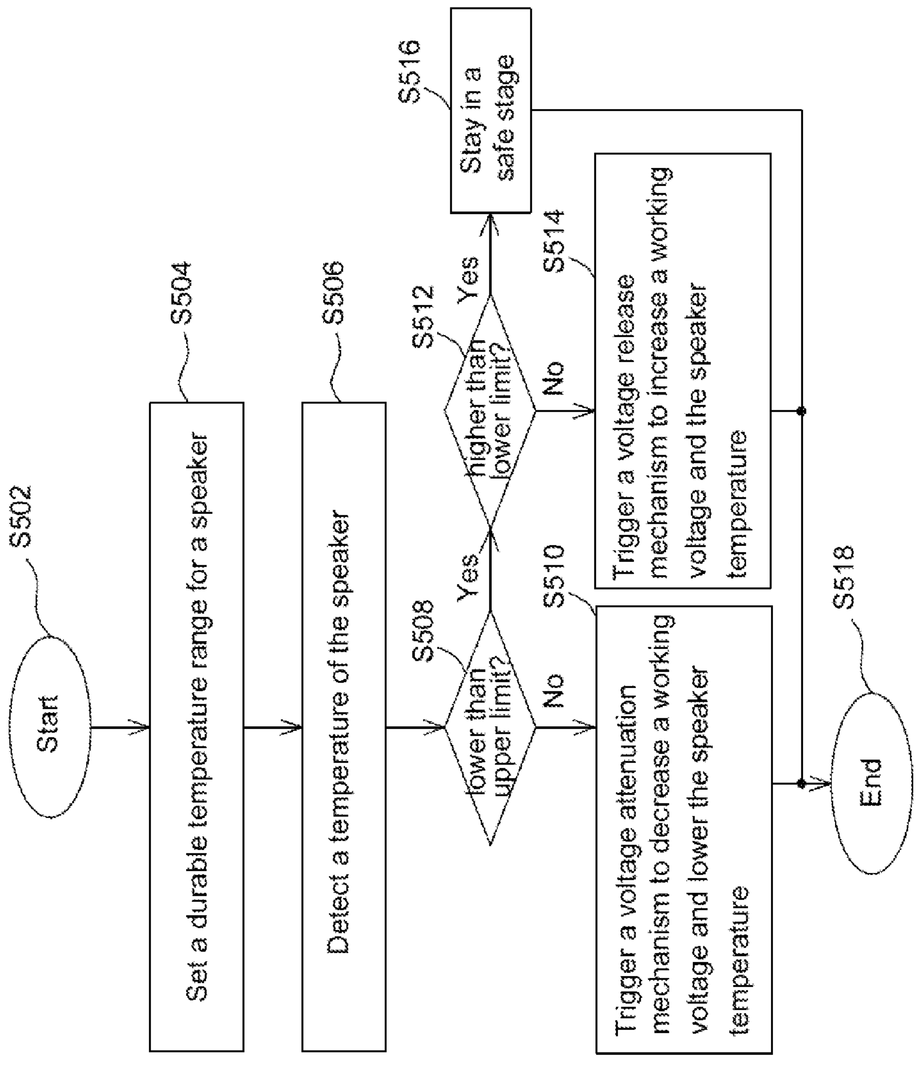
FIG. 5A shows a flowchart detailing a control method of an audio device according to an embodiment of the invention.
Figure 5B:
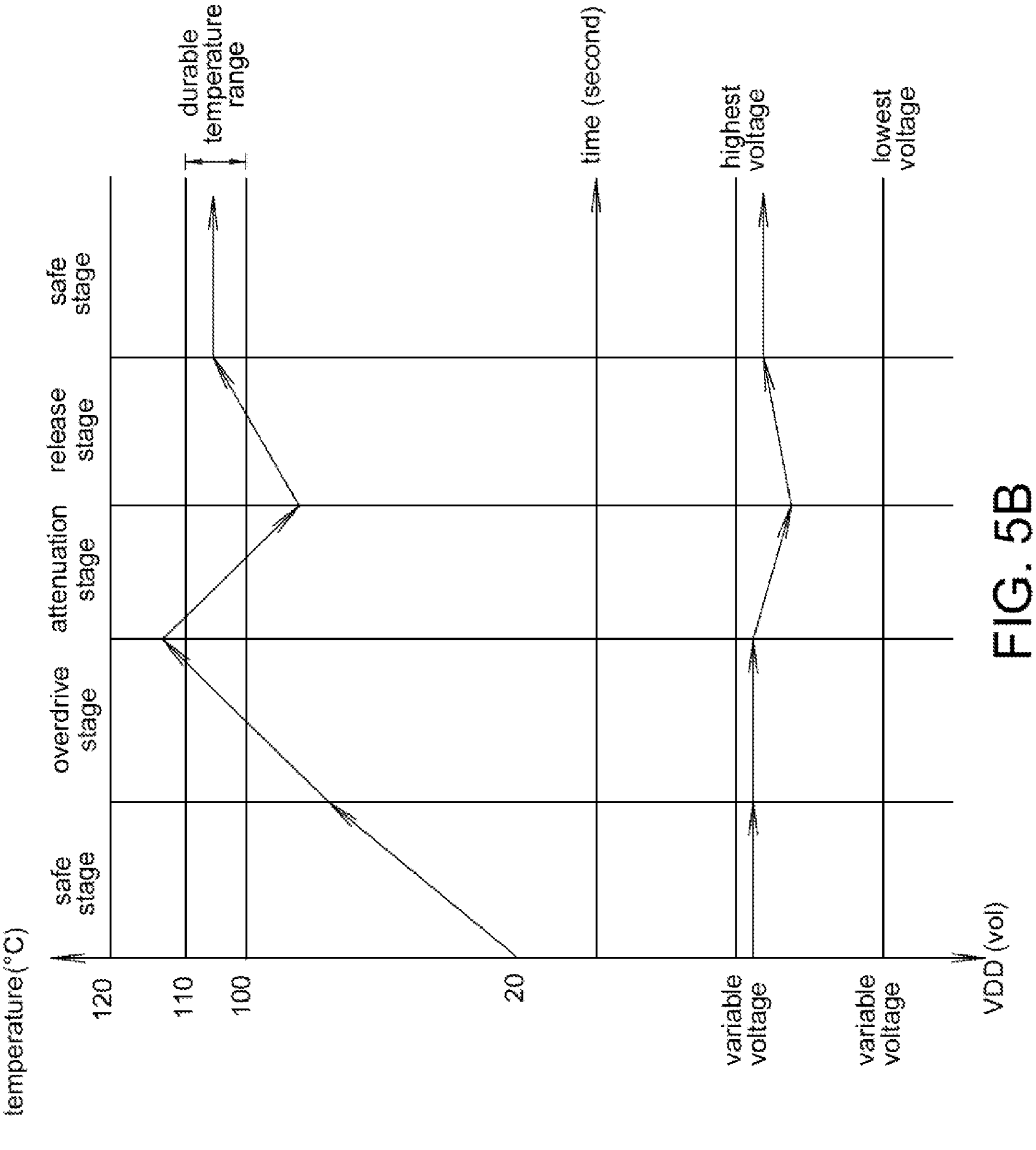
FIG. 5B shows a schematic diagram illustrating a thermal control process with reference to FIG. 5A.

FIG. 5A shows a flowchart detailing a control method of an audio device according to an embodiment of the invention. FIG. 5B shows a schematic diagram illustrating a thermal control process with reference to FIG. 5A, where the thermal control process includes a safe stage, an overdrive stage, an attenuation stage, and a release stage.

The control method of an audio device may include the following steps.

Step S502: Start.

Step S504: Set a durable temperature range for a speaker, where the temperature range may depend upon the characteristic of the speaker. An audio device may set a highest thermal threshold and a lowest thermal threshold for the speaker according to the characteristic of the speaker. In one embodiment shown in FIG. 5B, the highest thermal threshold (upper limit) is set as 110° C., and the lowest thermal threshold (lower limit) is set as 100° C. Corresponding to the durable temperature range, each of the first working voltage Vdd_amp and the second working voltage Vdd_dac supplied by a power management unit are set with a voltage range defined by an upper limit (highest voltage) and a lower limit (lowest voltage) shown in FIG. 5B.

Step S506: Detect a temperature of the speaker.

Step S508: Determine whether the temperature is lower than the upper limit (110° C.). If yes, go to Step S512; if no, go to Step S510.

Step: S510: When the temperature sensor detects that the temperature of the speaker is higher than the upper limit, the thermal control process moves to the overdrive stage to trigger a mechanism of voltage attenuation, where the power management unit decreases the first working voltage Vdd_amp for the amplifier and/or the second working voltage Vdd_dac for the digital-to-analog converter. Therefore, the sound volume of the speaker is lowered to decrease the temperature of the speaker; that is, the thermal control process moves at the attenuation stage.

Step S512: Determine whether the temperature is higher than the lower limit (100). If yes, go to Step S516; if no, go to Step S514.

Step S514: When the temperature sensor detects that the temperature of the speaker is smaller than the lower limit, the thermal control process moves to a release stage, where the first working voltage Vdd_amp and/or the second working voltage Vdd_dac is too low to sustain a proper working temperature for the speaker. Therefore, the first working voltage Vdd_amp and/or the second working voltage Vdd_dac should be released to a higher level. That is, in the release stage, the power management unit increases the second working voltage Vdd_dac and/or the first working voltage Vdd_amp to increase the temperature of the speaker and allow the thermal control process to move to a safe stage to achieve a maximum audio output.

Step S516: Determine whether the temperature of the speaker is located between the upper limit and the lower limit to stay in the safe stage of the thermal control process.

Step S518: End.

Note the afore-mentioned four stages are described only for exemplified purposes, and the transition sequence of the four stages can be adjusted according to actual demands. The upper or lower temperature limit mainly depends on the characteristic of the speaker and can be arbitrary selected according to actual demands. Further, the thermal control process is not limited to be divided into four stages, and the number of control stages may vary according to actual demands.

Accordingly to the above embodiments, the temperature of the speaker can be lowered by decreasing the working voltage for at least one of the digital-to-analog converter and the amplifier, without simply attenuating an input audio signal. Therefore, the dissipation of electric power is reduced to achieve the purpose of power saving, and the working temperature of the speaker is decreased to prevent the speaker from being overheated and damaged.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An audio device, comprising:

a digital-to-analog converter, configured to convert a digital audio signal into an analog audio signal;

an amplifier coupled to the digital-to-analog converter, configured to amplify the analog audio signal and generate an amplified analog audio signal;

a speaker coupled to the amplifier, configured to broadcast the amplified analog audio signal;

a power controller coupled to the amplifier and the digital-to-analog converter, configured to provide the amplifier with a first working voltage and provide the digital-to-analog converter with a second working voltage; and a temperature sensor coupled to the speaker, configured to generate a temperature detection signal according to a temperature of the speaker;

wherein the power controller adjusts at least one of the first working voltage and the second working voltage according to the temperature detection signal; and the audio device is coupled to a signal receiving circuit, and the signal receiving circuit comprises:

an audio processor having a gain controller, wherein the audio processor receives the digital audio signal, the gain controller applies gain to the digital audio signal, and the gain has a fixed value;

an up-converter for adjusting a frequency of the digital audio signal; and a modulator couples to the up-converter for modulating the frequency of the digital audio signal to a preset frequency band and then transmitting the digital audio signal to the digital-to-analog converter.

2. The audio device as claimed in claim 1, wherein the speaker comprises at least one resistor, and the temperature sensor detects a temperature of the resistor to generate the temperature detection signal.

3. The audio device as claimed in claim 2, wherein the power controller comprises a voltage controller, the voltage controller couples to the temperature detection signal and generates a first voltage control signal and a second voltage control signal according to the temperature detection signal.

4. The audio device as claimed in claim 3, wherein the power controller comprises:

a first power controller coupled to a power source and the voltage controller; the first power controller lowers the first working voltage for the amplifier according to the first voltage control signal to decrease a sound volume and the temperature of the speaker; and a second power controller coupled to the power source and the voltage controller; the second power controller lowers the second working voltage for the digital-to-analog converter according to the second voltage control signal to decrease the sound volume and the temperature of the speaker.

5. The audio device as claimed in claim 1, wherein the power controller sets a highest thermal threshold and a lowest thermal threshold for the speaker.

6. The audio device as claimed in claim 5, wherein, when the temperature sensor detects that the temperature of the speaker is higher than the highest thermal threshold, the power controller triggers a mechanism of voltage attenuation to decrease the first working voltage and/or the second working voltage.

7. The audio device as claimed in claim 5, wherein, when the temperature sensor detects that the temperature of the speaker is lower than the lowest thermal threshold, the power controller triggers a mechanism of voltage release to increase the first working voltage and/or the second working voltage.

8. A control method of an audio device, the audio device comprising an amplifier and a digital-to-analog converter, and the control method comprising the steps of:

setting a highest thermal threshold and a lowest thermal threshold for a speaker according to a characteristic of the speaker;

receiving a digital audio signal;

applying gain to the digital audio signal, and the gain has a fixed value;

adjusting a frequency of the digital audio signal;

modulating the frequency of the digital audio signal to a preset frequency band and then transmitting the digital audio signal to the digital-to-analog converter;

detecting a temperature of the speaker; and decreasing a working voltage for the amplifier and/or a working voltage for the digital-to-analog converter when the temperature of the speaker is higher than the highest thermal threshold, and, when the temperature of the speaker is lower than the lowest thermal threshold, increasing the working voltage for the amplifier and/or the working voltage for the digital-to-analog converter until the temperature of the speaker is higher than the lowest thermal threshold.

9. The control method as claim in claim 8, wherein the audio device operates in a safe stage when the temperature of the speaker is located between the highest thermal threshold and the lowest thermal threshold.

10. An audio device, comprising:

a digital-to-analog converter, configured to convert a digital audio signal into an analog audio signal;

an amplifier coupled to the digital-to-analog converter, configured to amplify the analog audio signal and generate an amplified analog audio signal;

a speaker coupled to the amplifier, configured to broadcast the amplified analog audio signal;

a power controller coupled to the amplifier and the digital-to-analog converter, configured to provide the amplifier with a first working voltage and provide the digital-to-analog converter with a second working voltage; and a temperature sensor coupled to the speaker, configured to generate a temperature detection signal according to a temperature of the speaker;

wherein the power controller adjusts at least one of the first working voltage and the second working voltage according to the temperature detection signal; the speaker comprises at least one resistor, and the temperature sensor detects a temperature of the resistor to generate the temperature detection signal; the power controller comprises a voltage controller, the voltage controller couples to the temperature detection signal and generates a first voltage control signal and a second voltage control signal according to the temperature detection signal; the power controller comprises a comparator, multiple switches, a first resistor and a second resistor, the power controller is coupled to a power supply voltage and multiplies the power supply voltage by a ratio to generate an output voltage serving as the first voltage control signal or the second voltage control signal, and the multiple switches are selectively turned on and off to change the ratio.

11. The audio device as claimed in claim 10, wherein the power-controller comprises:

a first power controller coupled to a power source and the voltage controller; the first power controller lowers the first working voltage for the amplifier according to the first voltage control signal to decrease a sound volume and the temperature of the speaker; and a second power controller coupled to the power source and the voltage controller; the second power controller lowers the second working voltage for the digital-to-analog converter according to the second voltage control signal to decrease the sound volume and the temperature of the speaker.

12. The audio device as claimed in claim 10, wherein the power controller sets a highest thermal threshold and a lowest thermal threshold for the speaker.

13. The audio device as claimed in claim 12, wherein, when the temperature sensor detects that the temperature of the speaker is higher than the highest thermal threshold, the power controller triggers a mechanism of voltage attenuation to decrease the first working voltage and/or the second working voltage.

14. The audio device as claimed in claim 13, wherein, when the temperature sensor detects that the temperature of the speaker is lower than the lowest thermal threshold, the power controller triggers a mechanism of voltage release to increase the first working voltage and/or the second working voltage.

* * * * *